United States Patent [19]

Fuoco

[11] Patent Number: 5,003,251
[45] Date of Patent: Mar. 26, 1991

[54] BAR CODE READER FOR PRINTED CIRCUIT BOARD

[75] Inventor: Frank J. Fuoco, Commack, N.Y.

[73] Assignee: Grumman Aerospace Corporation, Bethpage, N.Y.

[21] Appl. No.: 405,998

[22] Filed: Sep. 12, 1989

[51] Int. Cl.⁵ .................... G01R 1/02; G01R 31/02
[52] U.S. Cl. ........................ 324/158 F; 324/158 R; 437/8; 371/29.1
[58] Field of Search ............... 324/158 F, 158 R; 437/8; 371/29.1, 16.1; 29/710; 340/715

[56] References Cited

U.S. PATENT DOCUMENTS

| | | | |
|---|---|---|---|
| 4,434,489 | 2/1984 | Blyth | 340/705 |
| 4,570,217 | 2/1986 | Allen et al. | 364/900 |
| 4,592,053 | 5/1986 | Matsuura | 371/29.1 |
| 4,718,064 | 1/1988 | Edwards et al. | 364/200 |
| 4,850,104 | 7/1989 | Matrone et al. | 29/829 |
| 4,876,656 | 10/1989 | Leicht et al. | 364/559 |

FOREIGN PATENT DOCUMENTS

| | | | |
|---|---|---|---|
| 0028179 | 2/1980 | Japan | 371/29.1 |
| 0021838 | 2/1983 | Japan | 324/158 F |
| 0122262 | 7/1984 | Japan | 371/29.1 |
| 0136360 | 7/1985 | Japan | 324/158 F |
| 0284910 | 12/1986 | Japan | 437/8 |

Primary Examiner—Reinhard J. Eisenzopf
Assistant Examiner—William J. Burns
Attorney, Agent, or Firm—Pollock, VandeSande & Priddy

[57] ABSTRACT

A bar code is applied to a printed circuit board and uniquely identifies the board. When the circuitry on the board undergoes testing and evaluation, the results are stored in computer memory along with the identification number. Subsequent to the time of testing, if anyone is interested in reviewing the original test data, he need only scan the bar code which will indirectly address the test data. The bar code may be permanently programmed into an LCD which is mounted on the board, or may be permanently affixed to the board on a label.

6 Claims, 2 Drawing Sheets

BAR CODE READER FOR PRINTED CIRCUIT BOARD

FIELD OF THE INVENTION

The present invention relates to apparatus for testing printed circuit boards, and more particularly to a bar code reading system for identifying a particular printed circuit board with test results relating to the board.

BACKGROUND OF THE INVENTION

The testing of printed circuit boards is a common procedure, especially where high reliability circuitry is required. Many automated systems exist for checking out printed circuit boards. A number of these systems include electrically stressing the board circuitry while simultaneously thermally stressing it. Typically, the test results are evaluated and the board becomes accepted or rejected.

Oftentimes, failures occur after a board is accepted and an evaluation of such failures would be expedited if the original test results could be easily stored and accessed from a computer.

BRIEF DESCRIPTION OF THE INVENTION

The present invention offers two embodiments for automatically assigning a bar code identification number to a particular printed circuit board undergoing testing. The test results may be stored in a computer along with the corresponding bar code identification number. At any time after the test, if a review of the test results is desirable, the bar code need only be scanned and this can indirectly address the test results for the particular board. This system was broadly discussed in co-pending U.S. application Ser. No. 263,219, now abandoned, assigned to the present assignee. As will be appreciated, this bar code system offers a rapid and automatic means for correlating a particular printed circuit board with its test data and the ability to quickly scan the bar code at a subsequent time enables retrieval of the test results for further evaluation in a prompt and simple manner.

BRIEF DESCRIPTION OF THE FIGURES

The above-mentioned objects and advantages of the present invention will be more clearly understood when considered in conjunction with the accompanying drawings, in which.

DETAILED DESCRIPTION OF THE INVENTION

Figure 1:
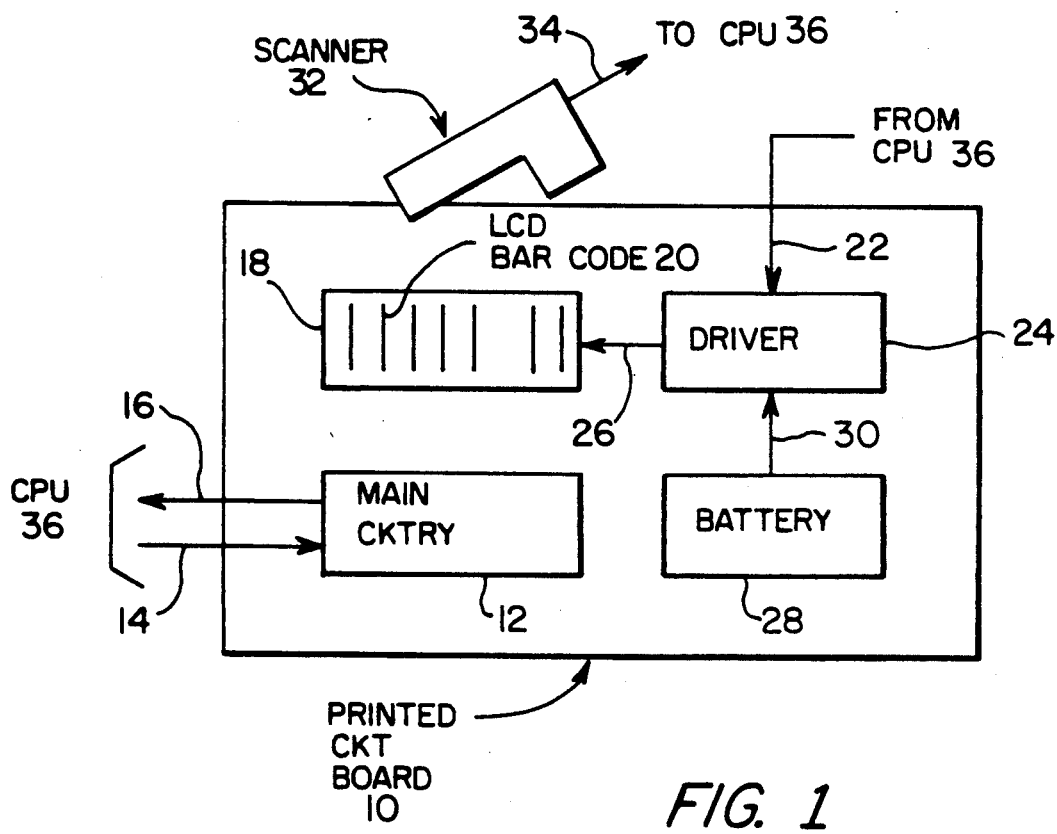
FIG. 1 is a schematic illustration of a first embodiment of the present invention wherein a programmable LCD is employed to permanently display a bar code identifying a printed circuit board.

FIG. 1 illustrates a first embodiment of the present invention wherein a programmable LCD 18 displays a bar code which serves as an identification number for a printed circuit board 10 upon which the LCD is mounted. A schematic illustration of FIG. 1 indicates the presence of the main circuitry 12 of the printed circuit board 10 which communicates with a central processing unit (CPU) by input 14 and output 16. The input and output to the main circuitry 12 are used during a test procedure for ascertaining proper operation of the main circuitry 12. As will be explained shortly hereinafter, the programmable LCD 18 is capable of displaying a bar code 20 which is assigned by a CPU during testing of the circuitry 12. The particular bar code selected by the computer subsequently serves as an identification number for the printed circuit board 10.

In order to program the LCD, an input 22 from the CPU provides the necessary bar code data to a conventional LCD driver 24. The driver is maintained operational so as to permanently display the bar code 20 by means of a long life battery 28 which is connected by lead 30 to the power input of driver 24.

The test results accorded by the CPU of the main circuitry 12 are stored in external memory along with the computer-selected bar code identification number. This number may subsequently be used to indirectly address the test results of a particular board 10.

In order to rapidly access the test results at a time subsequent to the testing of the board 10, a conventional bar code scanner 32 may be employed. By scanning the bar code 20, the test results for a particular board 10 may be quickly printed out or displayed on a CRT (not shown).

Figure 2:
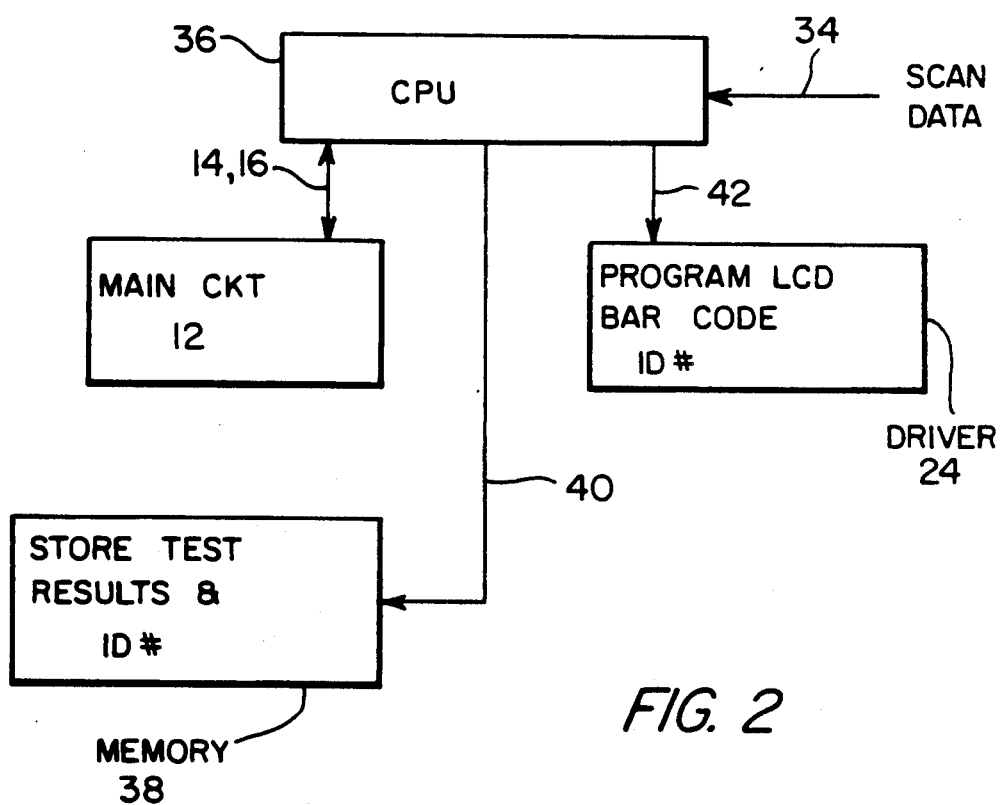
FIG. 2 is a simplified block diagram of a system for storing test results along with a corresponding printed circuit board identification number.

FIG. 2 illustrates in block diagram form a basic electronic system for accomplishing the purposes discussed in connection with FIG. 1. Along with providing test stimulus signals and recording resultant signals therefrom along leads 14 and 16, the CPU 36 also programs the LCD 18 as previously mentioned. In FIG. 2 a computer memory 38 is seen to store results from testing the main circuit 12 as provided along input 40. CPU output 40 provides an automatically selected and unique bar code identification number selected by CPU 36 and stored in memory 38. Memory 38 stores the test results along with the unique corresponding bar code identification number of the printed circuit board to which the test results pertain. Initially, lead 42 from the CPU provides the identification number to the driver 24 which drives the LCD 18 via lead 26 (FIG. 1) to display the corresponding bar code 20.

As previously mentioned, in the event that a particular printed circuit board 10 is to have its main circuitry 12 further analyzed, the LCD bar code 20 need only be scanned, the output from scanner 32 being fed, along lead 34, to CPU 36. This will permit indirect addressing of the test results for the main circuitry 12, which may be printed out in hard copy form or displayed on a CRT (not shown).

Figure 3:
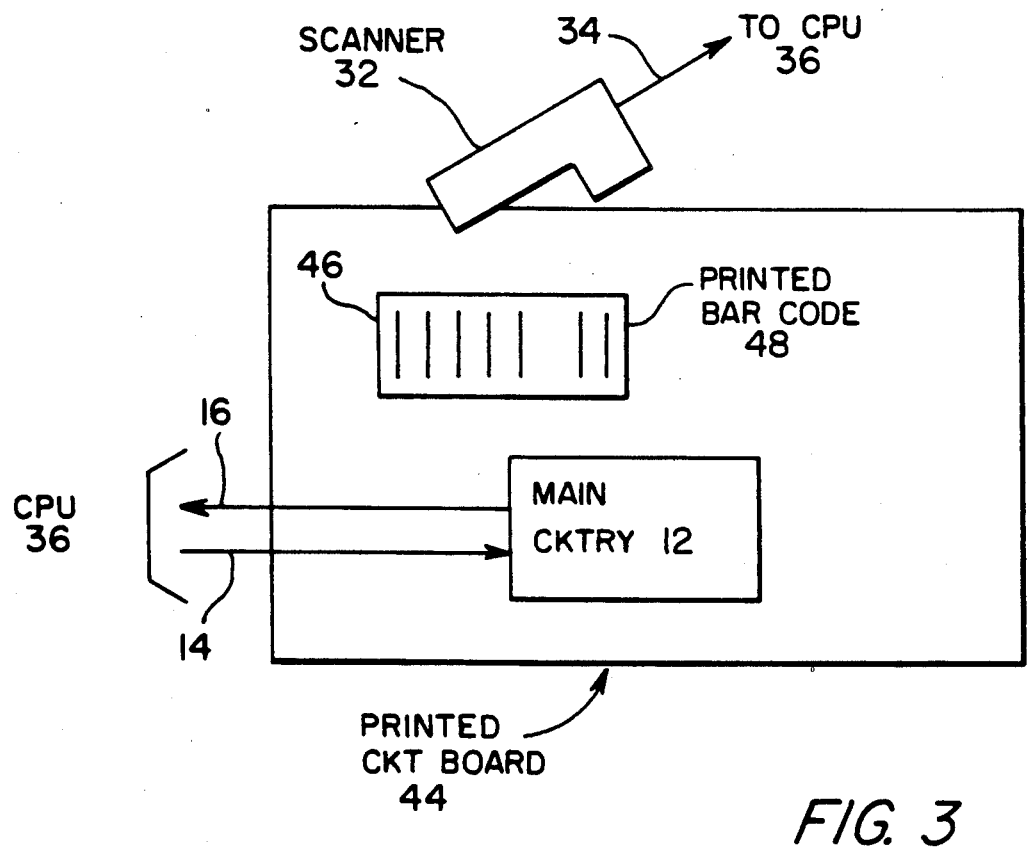
FIG. 3 is a schematic illustration of a second embodiment of the invention wherein an automatically printed bar code is employed in lieu of an LCD.
Figure 4:
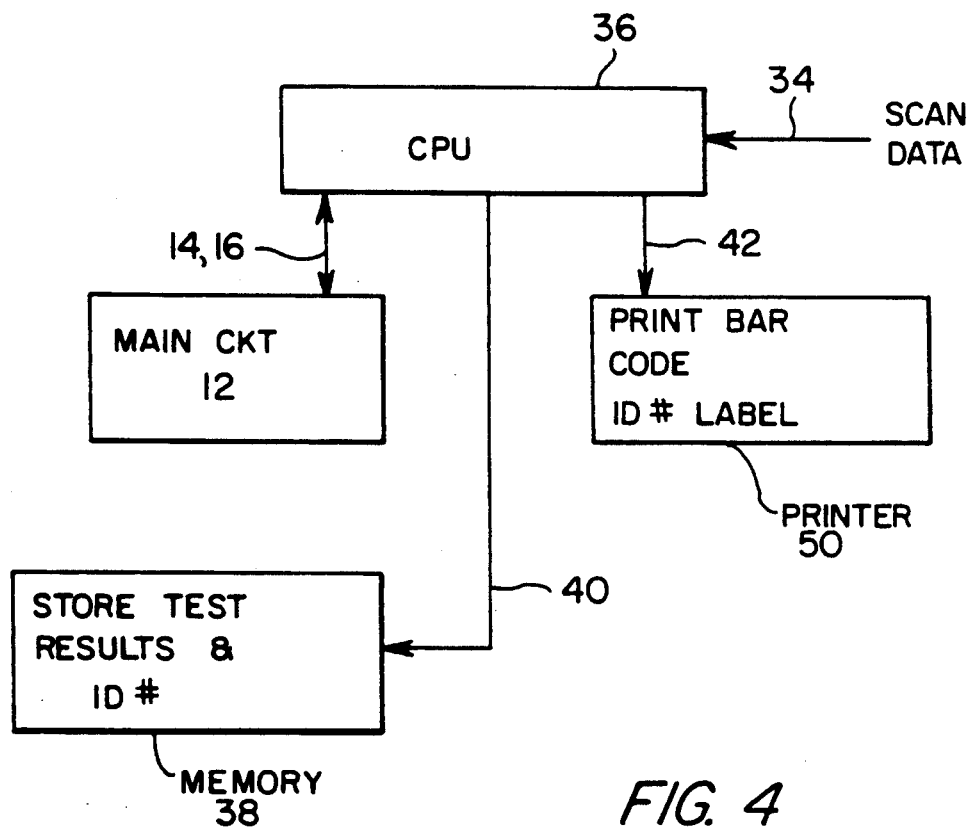
FIG. 4 is a block diagram of a system for storing test results and a corresponding identification number for a printed circuit board in accordance with FIG. 3.

FIG. 3 illustrates a second embodiment of the present invention wherein the LCD 18 is replaced by a label 46 printed with a unique bar code 48. In a second embodiment the printed label eliminates the need for driver 24 and battery 28 (FIG. 1). Thus, referring to FIG. 4, it will be appreciated that the electronic system for carrying out the purposes of the second embodiment requires means for automatically printing the bar code on label 46 instead of programming an LCD. As shown in FIG. 4, this is accomplished by employing a printer, such as a laser jet printer 50 provided with an identification number input along lead 42. Since each individually printed label includes a unique identification bar code, a scanner 32 may be employed at any time after a circuit board 44 is tested to recall the test results as was previously explained in connection with the first embodiment (FIGS. 1 and 2).

Accordingly, as will be appreciated from the foregoing description of the invention, a printed circuit board may automatically be assigned a bar code, the identification number of which is automatically stored along with test results of the printed circuit board circuitry. Subsequent to testing the conventional bar code reader may be employed to read the bar code which will indirectly access the test results incident to the particular printed circuit board. This, of course, provides rapid access to initial test results which is greatly desirable in the event that subsequent analysis of on the printed circuit board is desired.

It should be understood that the invention is not limited to the exact details of construction shown and described herein for obvious modifications will occur to persons skilled in the art.

I claim:

1. A method for identifying a tested printed circuit board comprising the steps:
    subjecting the board to computer-generated electrical stimuli for testing the circuitry of the board;
    storing the test results in computer memory;
    assigning an identification number for the board by the computer;
    preparing a machine-readable code by the computer, corresponding to the identification number;
    permanently displaying the code on the board;
    subsequently scanning the code for generating an indirect address corresponding to the code;
    accessing the test results for the particular board.

2. The method set forth in claim 1 wherein the machine-readable code is bar code.

3. The method set forth in claim 2 wherein the machine-readable code is prepared by programming an LCD with the code.

4. The method set forth in claim 2 wherein the machine-readable code is prepared on a label printed on a printer driven by the computer.

5. A method for identifying a tested printed circuit board comprising the steps:
    subjecting the board to computer-generated electrical stimuli for testing the circuitry of the board;
    storing the test results in computer memory;
    assigning an identification number for the board by the computer;
    programming an LCD mounted on the board with a unique bar code corresponding to the identification number; and
    subsequently scanning the code with a bar code reader for generating an indirect address corresponding to the code; and
    accessing the test results for the particular board.

6. A method for identifying a tested print circuit board comprising the steps:
    subjecting the board to computer-generated electrical stimuli for testing the circuitry of the board;
    storing the test results in computer memory;
    assigning an identification number for the board by the computer;
    printing a bar code on a label under the direction of the computer, corresponding to the identification number;
    affixing the label to the board for permanently displaying the code on the board;
    subsequently scanning the code with a bar code reader for generating an indirect address corresponding to the code; and
    accessing the test results for the particular board.

* * * * *